United States Patent
Sun et al.

(10) Patent No.: US 10,432,146 B2
(45) Date of Patent: Oct. 1, 2019

(54) POWER AMPLIFIER, POWER AMPLIFICATION METHOD, AND POWER AMPLIFICATION CONTROL APPARATUS AND METHOD

(71) Applicant: Huawei Technologies Co., Ltd., Shenzhen (CN)

(72) Inventors: Jie Sun, Shanghai (CN); Zhixiong Zeng, Shanghai (CN); Shengbo Wu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/881,272

(22) Filed: Jan. 26, 2018

(65) Prior Publication Data

US 2018/0152150 A1 May 31, 2018

Related U.S. Application Data

(63) Continuation of application No. PCT/CN2015/085314, filed on Jul. 28, 2015.

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/0294* (2013.01); *H03F 3/19* (2013.01);
(Continued)

(58) Field of Classification Search
CPC .................. H03F 1/0288; H03F 3/68
(Continued)

(56) References Cited

U.S. PATENT DOCUMENTS 8,824,978 B2 * 9/2014 Briffa .................. H03F 1/32
330/124 R
2007/0080747 A1 4/2007 Klingberg et al.
(Continued)

FOREIGN PATENT DOCUMENTS

CN 102237852 A 11/2011
CN 102427332 A 4/2012
(Continued)

OTHER PUBLICATIONS

Andersson, et al., "A 1-3-GHz Digitally Controlled Dual-RF Input Power-Amplifier Design Based on a Doherty-Outphasing Continuum Analysis," IEEE Transactions on Microwave Theory and Techniques, vol. 61, No. 10, Oct. 2013, pp. 3743-3752.

*Primary Examiner* — Steven J Mottola
(74) *Attorney, Agent, or Firm* — Slater Matsil, LLP

(57) ABSTRACT

Embodiments of the present application provide a power amplifier, a power amplification method, and a power amplification control apparatus and method. The power amplifier includes n Doherty power amplification units connected in parallel and an n-way outphasing combiner, where n≥2 and n is an integer. Each Doherty power amplification unit includes one input end and one output end. The n-way outphasing combiner includes n input ends and one output end. The output ends of the Doherty power amplification units are separately connected to the input ends of the n-way outphasing combiner.

20 Claims, 8 Drawing Sheets

(51) Int. Cl.
  *H03F 3/19* (2006.01)
  *H03F 3/24* (2006.01)
  *H03F 3/60* (2006.01)
  *H03F 3/62* (2006.01)
  *H03F 3/21* (2006.01)
  *H04W 88/08* (2009.01)

(52) U.S. Cl.
  CPC ............. *H03F 3/211* (2013.01); *H03F 3/245* (2013.01); *H03F 3/602* (2013.01); *H03F 3/62* (2013.01); *H03F 2200/451* (2013.01); *H04W 88/08* (2013.01)

(58) Field of Classification Search
  USPC .............................................. 330/124 R, 295
  See application file for complete search history.

(56) References Cited

U.S. PATENT DOCUMENTS

| | | |
|---|---|---|
| 2008/0284509 A1 | 11/2008 | Kim et al. |
| 2009/0021301 A1 | 1/2009 | Hellberg et al. |
| 2009/0167434 A1 | 7/2009 | Elmala |
| 2012/0126890 A1* | 5/2012 | Svechtarov ........... H03F 1/0288 330/124 R |
| 2013/0241625 A1* | 9/2013 | Perreault ............... H03F 1/0294 327/355 |
| 2014/0240039 A1 | 8/2014 | Pengelly |
| 2014/0306765 A1 | 10/2014 | Zhang et al. |
| 2014/0368274 A1 | 12/2014 | Kimura |
| 2015/0194938 A1 | 7/2015 | Negra et al. |
| 2016/0248383 A1 | 8/2016 | Otake |

FOREIGN PATENT DOCUMENTS

| | | |
|---|---|---|
| CN | 103415993 A | 11/2013 |
| CN | 103580623 A | 2/2014 |
| CN | 104242840 A | 12/2014 |
| DE | 102012210249 A1 | 12/2013 |
| JP | 2010530148 A | 9/2010 |
| WO | 0191282 A2 | 11/2001 |
| WO | 2014070475 A1 | 5/2014 |
| WO | 2015057118 A1 | 4/2015 |
| WO | 2015071931 A1 | 5/2015 |

* cited by examiner

POWER AMPLIFIER, POWER AMPLIFICATION METHOD, AND POWER AMPLIFICATION CONTROL APPARATUS AND METHOD

CROSS-REFERENCE TO RELATED APPLICATIONS

This application is a continuation of International Application No. PCT/CN2015/085314, filed on Jul. 28, 2015, which is hereby incorporated by reference in the entirety.

TECHNICAL FIELD

The present application relates to the field of power amplifiers, and in particular, to a power amplifier, a power amplification method, and a power amplification control apparatus and method.

BACKGROUND

As a radio frequency signal transceiver, a radio base station is configured to amplify an input signal by using a power amplifier (PA for short), and transmit the amplified input signal by using a transmitter. A power amplifier is a component consuming most power in a radio base station, and efficiency of the power amplifier directly affects power consumption of the entire radio base station.

A Doherty power amplifier is usually used in an existing radio base station, to reduce power consumption of the radio base station.

The Doherty power amplifier includes a primary power amplifier and at least one peak power amplifier. The primary power amplifier is connected in parallel to each peak power amplifier. A working principle of the Doherty power amplifier is that the primary power amplifier and each peak power amplifier can work in saturation regions thereof by using an active-load pulling technology, thereby ensuring that the entire Doherty power amplifier has relatively high efficiency within an input power range as large as possible.

In a process of implementing the present application, the inventor finds that the prior art has at least the following problem.

If a Doherty power amplifier having the existing architecture is used, to maintain high efficiency, a corresponding input power changing range is relatively small, and power consumption increases when the input power changing range is relatively large. This cannot meet a requirement of a radio base station for power consumption.

SUMMARY

To resolve a problem in the prior art that if a Doherty power amplifier having the existing architecture is used, to maintain high efficiency, a corresponding input power changing range is relatively small, and power consumption increases when the input power changing range is relatively large, embodiments of the present application provide a power amplifier, a power amplification method, and a power amplification control method and apparatus. The technical solutions are as follows:

According to a first aspect, a power amplifier is provided, and the power amplifier includes: n Doherty power amplification units connected in parallel and an n-way outphasing combiner, where n≥2 and n is an integer. Each Doherty power amplification unit includes one input end and one output end. The n-way outphasing combiner includes n input ends and one output end. The output ends of the Doherty power amplification units are separately connected to the input ends of the n-way outphasing combiner.

In a first possible implementation of the first aspect, each Doherty power amplification unit is an m-way Doherty power amplification unit, the m-way Doherty power amplification unit includes one primary power amplifier and (m−1) peak power amplifiers, where m≥2 and m is an integer, and the Doherty power amplification units have a same quantity or different quantities of ways; and in each m-way Doherty power amplification unit, the primary power amplifier is connected in parallel to each peak power amplifier, and the peak power amplifiers are connected in parallel.

With reference to the first possible implementation of the first aspect, in a second possible implementation of the first aspect, the m-way Doherty power amplification unit is a two-way symmetric Doherty power amplification unit, the two-way symmetric Doherty power amplification unit includes one primary power amplifier and one peak power amplifier, and transistors having a same power are used in the primary power amplifier and the peak power amplifier; or the m-way Doherty power amplification unit is a two-way asymmetric Doherty power amplification unit, the two-way asymmetric Doherty power amplification unit includes one primary power amplifier and one peak power amplifier, and transistors having different powers are used in the primary power amplifier and the peak power amplifier.

With reference to the first aspect, the first possible implementation of the first aspect, and the second possible implementation of the first aspect, in a third possible implementation of the first aspect, the n-way outphasing combiner is a Chireix combiner.

According to a second aspect, a power amplification method is provided, and is applied to the power amplifier according to the first aspect, and the method includes receiving input signals by means of the input ends of the Doherty power amplification units. All or some of the Doherty power amplification units and the n-way outphasing combiner are triggered, according to power level of the input signals, to be in a working state.

In a first possible implementation of the second aspect, the triggering includes that when the power levels of the input signals received by the Doherty power amplification units are less than a first power threshold, and the input signals received by the Doherty power amplification units are non-outphasing, the primary power amplifier and each peak power amplifier in each Doherty power amplification unit are triggered to be in a working state, and the n-way outphasing combiner is triggered to be in a non-outphasing working state, where the first power threshold is greater than an initial working power of each peak power amplifier in each Doherty power amplification unit. The triggering also includes that when the power levels of the input signals received by the Doherty power amplification units are greater than the first power threshold, and the input signals received by the Doherty power amplification units are outphasing, the primary power amplifier and each peak power amplifier in each Doherty power amplification unit are triggered to be in a working state, and the n-way outphasing combiner is triggered to be in an outphasing working state. The non-outphasing working state is a working state in which the n-way outphasing combiner directly combines the signals received by the input ends, and the outphasing working state is a working state in which the n-way outphasing combiner performs phase adjustment on the signals received by the input ends, and then combines the signals.

In a second possible implementation of the second aspect, the triggering includes that when the power levels of the input signals received by the Doherty power amplification units are less than a second power threshold, and the input signals received by the Doherty power amplification units are outphasing, the primary power amplifier in each Doherty power amplification unit are triggered to be in a working state, and the n-way outphasing combiner is triggered to be in a non-outphasing working state, where the second power threshold is less than an initial working power of each peak power amplifier in each Doherty power amplification unit. The triggering also includes that when the power levels of the input signals received by the Doherty power amplification units are greater than the second power threshold, and the input signals received by the Doherty power amplification units are non-outphasing, the primary power amplifier and each peak power amplifier in each Doherty power amplification unit are triggered to be in a working state, and the n-way outphasing combiner is triggered to be in a non-outphasing working state. The non-outphasing working state is a working state in which the n-way outphasing combiner directly combines the signals received by the input ends, and the outphasing working state is a working state in which the n-way outphasing combiner performs phase adjustment on the signals received by the input ends, and then combines the signals.

According to a third aspect, a power amplification control apparatus is provided, and is applied to a signal control system. The signal control system is configured to provide n input signals for the power amplifier according to the first aspect, where n≥2 and n is an integer, and the apparatus includes a processing module, configured to determine, according to a working mode of the power amplifier, a power threshold corresponding to the power amplifier, where the power threshold is used to instruct the signal control system to adjust, when powers of the n input signals reach the power threshold, the n input signals to n non-outphasing input signals or n outphasing input signals. The processing module is further configured to adjust, when the power levels of the n input signals reach the power threshold, the n input signals to the n non-outphasing input signals or the n outphasing input signals. The apparatus also includes a sending module, configured to send the n adjusted input signals separately to the input ends of the Doherty power amplification units.

In a first possible implementation of the third aspect, the working mode of the power amplifier is a first working mode, and the corresponding power threshold is a first power threshold, where the first power threshold is greater than an initial working power of each peak power amplifier in each Doherty power amplification unit. The processing module is further configured to adjust, when the power levels of the n input signals reach the first power threshold, the n input signals to the n outphasing input signals.

With reference to the first possible implementation of the third aspect, in a second possible implementation of the third aspect, the processing module is further configured to adjust, when the power levels of the n input signals do not reach the first power threshold, the n input signals to the n non-outphasing input signals.

In a third possible implementation of the third aspect, the working mode of the power amplifier is a second working mode, and the corresponding power threshold is a second power threshold, where the second power threshold is less than an initial working power of each peak power amplifier in each Doherty power amplification unit. The processing module is further configured to adjust, when the power levels of the n input signals reach the second power threshold, the n input signals to the n non-outphasing input signals.

With reference to the third possible implementation of the third aspect, in a fourth possible implementation of the third aspect, the processing module is further configured to adjust, when the power levels of the n input signals do not reach the second power threshold, the n input signals to the n outphasing input signals.

According to a fourth aspect, a power amplification control apparatus is provided, and is applied to a signal control system. The signal control system is configured to provide n input signals for the power amplifier according to the first aspect, where n≥2 and n is an integer, and the apparatus includes a processor, configured to determine, according to a working mode of the power amplifier, a power threshold corresponding to the power amplifier. The power threshold is used to instruct the signal control system to adjust, when powers of the n input signals reach the power threshold, the n input signals to n non-outphasing input signals or n outphasing input signals. The processor is further configured to adjust, when the power levels of the n input signals reach the power threshold, the n input signals to the n non-outphasing input signals or the n outphasing input signals. The processor is further configured to control a transceiver to send the n adjusted input signals separately to the input ends of the Doherty power amplification units.

In a first possible implementation of the fourth aspect, the working mode of the power amplifier is a first working mode, and the corresponding power threshold is a first power threshold, where the first power threshold is greater than an initial working power of each peak power amplifier in each Doherty power amplification unit. The processor is further configured to adjust, when the power levels of the n input signals reach the first power threshold, the n input signals to the n outphasing input signals.

With reference to the first possible implementation of the fourth aspect, in a second possible implementation of the fourth aspect, the processor is further configured to adjust, when the power levels of the n input signals do not reach the first power threshold, the n input signals to the n non-outphasing input signals.

With reference to the fourth aspect, in a third possible implementation of the fourth aspect, the working mode of the power amplifier is a second working mode, and the corresponding power threshold is a second power threshold, where the second power threshold is less than an initial working power of each peak power amplifier in each Doherty power amplification unit. The processor is further configured to adjust, when the power levels of the n input signals reach the second power threshold, the n input signals to the n non-outphasing input signals.

With reference to the third possible implementation of the fourth aspect, in a fourth possible implementation of the fourth aspect, the processor is further configured to adjust, when the power levels of the n input signals do not reach the second power threshold, the n input signals to the n outphasing input signals.

According to a fifth aspect, a power amplification control method is provided, and is applied to a signal control system. The signal control system is configured to provide n input signals for the power amplifier according to the first aspect, where n≥2 and n is an integer, and the method includes determining, according to a working mode of the power amplifier, a power threshold corresponding to the power amplifier, where the power threshold is used to instruct the signal control system to adjust, when powers of the n input signals reach the power threshold, the n input signals to n non-outphasing input signals or n outphasing input signals. The method also includes adjusting, when the power levels of the n input signals reach the power threshold, the n input signals to the n non-outphasing input signals or the n outphasing input signals. The method further includes and sending the n adjusted input signals separately to the input ends of the Doherty power amplification units.

In a first possible implementation of the fifth aspect, the working mode of the power amplifier is a first working mode, and the corresponding power threshold is a first power threshold, where the first power threshold is greater than an initial working power of each peak power amplifier in each Doherty power amplification unit. Adjusting the n input signals to the n non-outphasing input signals or the n outphasing input signals includes: adjusting, when the power levels of the n input signals reach the first power threshold, the n input signals to the n outphasing input signals.

With reference to the first possible implementation of the fifth aspect, in a second possible implementation of the fifth aspect, the method further includes adjusting, when the power levels of the n input signals do not reach the first power threshold, the n input signals to the n non-outphasing input signals.

In a third possible implementation of the fifth aspect, the working mode of the power amplifier is a second working mode, and the corresponding power threshold is a second power threshold, where the second power threshold is less than an initial working power of each peak power amplifier in each Doherty power amplification unit. Adjusting the n input signals to the n non-outphasing input signals or the n outphasing input signals includes adjusting, when the power levels of the n input signals reach the second threshold, the n input signals to the n non-outphasing input signals.

With reference to the third possible implementation of the fifth aspect, in a fourth possible implementation of the fifth aspect, the method further includes adjusting, when the power levels of the n input signals do not reach the second power threshold, the n input signals to the n outphasing input signals.

The technical solutions provided in the embodiments of the present application have the following beneficial effects.

A power amplifier having a structure including n Doherty power amplification units connected in parallel and an n-way outphasing combiner is used, and the power amplifier triggers, according to input powers of received signals, all or some of the Doherty power amplification units and the n-way outphasing combiner to be in a working state. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

To make the objectives, technical solutions, and advantages of the present application clearer, the following further describes the embodiments of the present application in detail with reference to the accompanying drawings.

For ease of understanding, first, some terminologies in embodiments of the present application are explained.

Outphasing power amplifier: An outphasing power amplifier includes two power amplifiers connected in parallel and a two-way outphasing combiner. A working principle of the outphasing power amplifier is that the two power amplifiers separately amplify two received outphasing input signals, and the outphasing combiner combines the two amplified input signals, thereby improving efficiency of the power amplifier.

Figure 1:
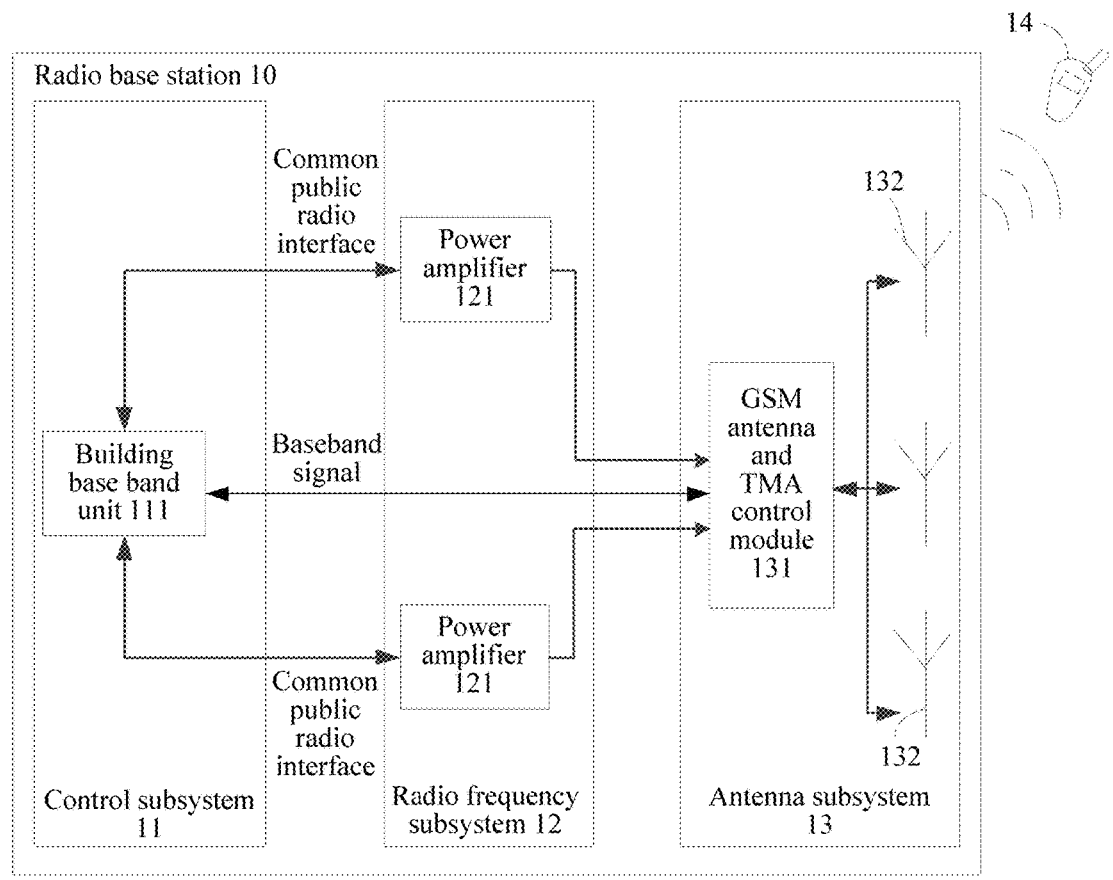
FIG. 1 is a block diagram of a structure of a radio base station according to an embodiment of the present application.

A radio base station is a radio frequency signal transceiver, and is configured to provide a radio frequency signal for a mobile terminal within a signal coverage range of the radio base station. As shown in FIG. 1, a radio base station 10 generally includes a control subsystem 11, a radio frequency subsystem 12, and an antenna subsystem 13.

Using that the radio base station 10 transmits a radio frequency signal as an example, after receiving a baseband signal sent by the antenna subsystem 13, the control subsystem 11 processes, by using a building base band unit (BBU) in, the baseband signal that is not modulated, and sends the processed signal to the radio frequency subsystem 12 by means of a common public radio interface (CPRI). To ensure strength of the radio frequency signal received by a mobile terminal 14, the radio frequency subsystem 12 needs to amplify the received signal by using a power amplifier 121 inside the radio frequency subsystem 12. After amplifying the signal, the power amplifier 121 sends the amplified signal to the antenna subsystem 13. A global system for mobile communications (GSM) antenna and tower mounted amplifier (TMA) control module (GATM) 131 in the antenna subsystem 13 controls a TMA 132 to transmit the signal.

It should be noted that, a person skilled in the art may understand that, the radio base station further includes another conventional subsystem, and the control subsystem, the radio frequency subsystem, and that the antenna frequency subsystem further include other conventional components, and details are not described herein again.

Working efficiency of a power amplifier, which is a component consuming most power in a radio base station, directly affects power consumption of the entire radio base station. To reduce power consumption of a radio base station, in the prior art, a Doherty power amplifier, as a dominant high-efficiency power amplifier, is usually used in a radio base station.

Figure 2:
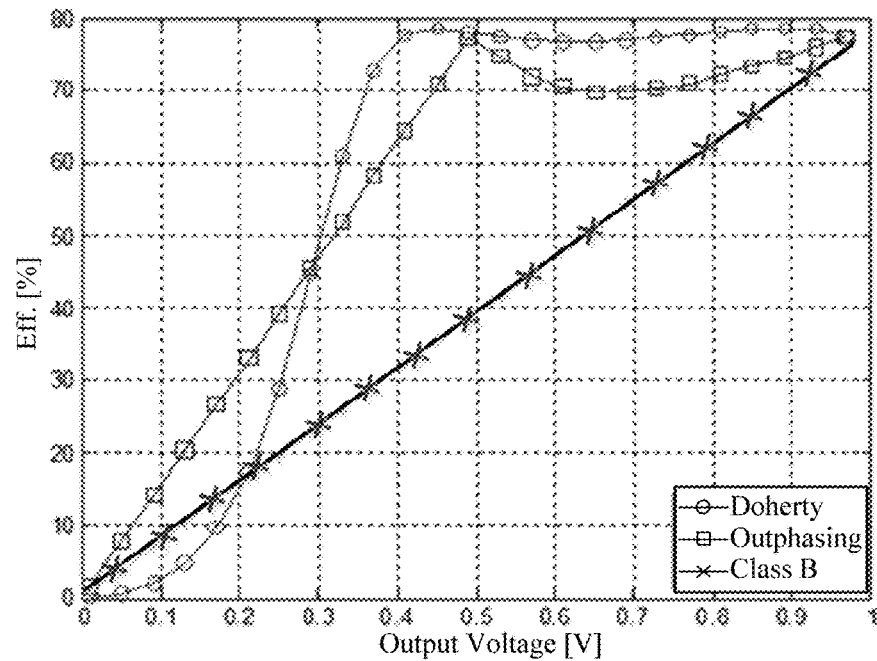
FIG. 2 is an efficiency curve chart of a Doherty power amplifier, an outphasing power amplifier, and a conventional class-B power amplifier.

FIG. 2 is an efficiency curve chart of a Doherty power amplifier, an outphasing power amplifier, and a conventional class-B power amplifier. A horizontal coordinate of the efficiency curve chart is an output voltage of a power amplifier after normalization, and a vertical coordinate of the efficiency curve chart is efficiency of the power amplifier.

An output voltage is in direct proportion to an input power. Compared with the conventional class-B power amplifier, the Doherty power amplifier and the outphasing power amplifier have apparently higher efficiency within a relatively large input power range.

Figure 3:
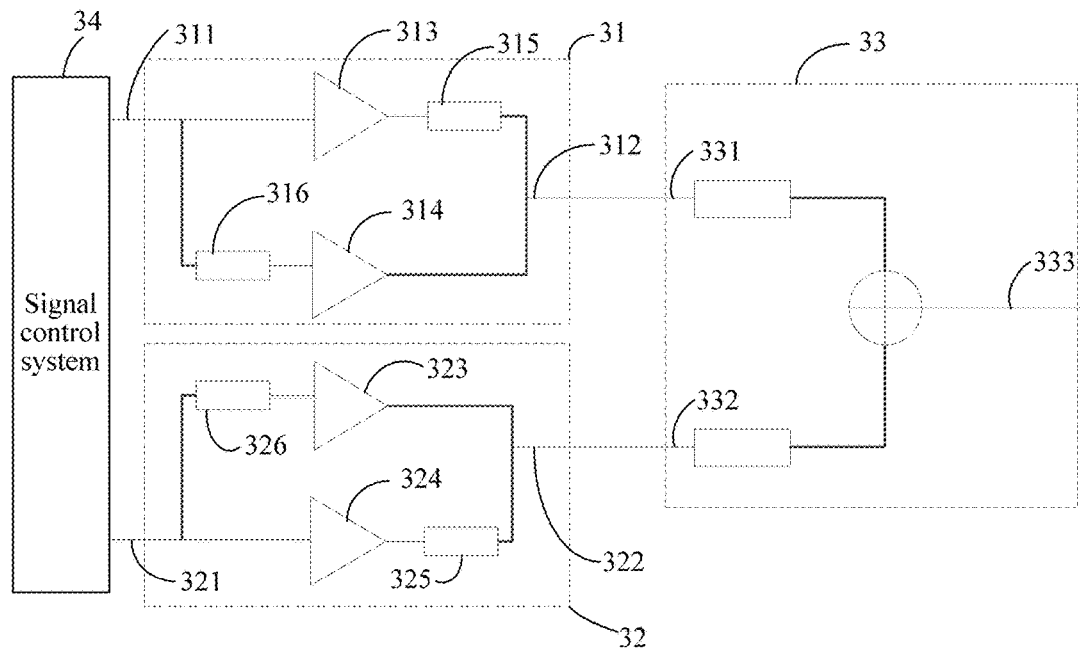
FIG. 3 is a schematic structural diagram of a power amplifier according to an embodiment of the present application.

Referring to FIG. 3, FIG. 3 is a schematic structural diagram of a power amplifier according to an embodiment of the present application. The power amplifier includes two Doherty power amplification units connected in parallel and one two-way outphasing combiner.

A first Doherty power amplification unit 31 and a second Doherty power amplification unit 32 are connected in parallel. The first Doherty power amplification unit 31 includes an input end 311 and an output end 312. The second Doherty power amplification unit 32 includes an input end 321 and an output end 322.

The two-way outphasing combiner 33 includes two input ends and one output end, which are respectively a first input end 331, a second input end 332, and an output end 333. The two-way outphasing combiner may be a Chireix combiner or another combiner having an outphasing combination function. The type of the outphasing combiner is not limited in the present application.

The output end 312 of the first Doherty power amplification unit 31 is electrically connected to the first input end 331 of the two-way outphasing combiner 33. The output end 322 of the second Doherty power amplification unit 32 is electrically connected to the second input end 332 of the two-way outphasing combiner 33.

The input end 311 of the first Doherty power amplification unit 31 and the input end 321 of the second Doherty power amplification unit 32 are both configured to receive an input signal sent by a signal control system 34. The output end 312 of the first Doherty power amplification unit 31 and the output end 322 of the second Doherty power amplification unit 32 are both configured to send an amplified input signal to the two-way outphasing combiner 33. The two-way outphasing combiner 33 amplifies signals received by means of the first input end 331 and the second input end 332, combines the signals, and then sends, by means of the output end 333, the signals after combination to a transmitter (which is not shown) for transmission.

In FIG. 3, the first Doherty power amplification unit 31 and the second Doherty power amplification unit 32 are each a two-way Doherty power amplification unit. That is, the first Doherty power amplification unit 31 and the second Doherty power amplification unit 32 each include a primary power amplifier and a peak power amplifier. The primary power amplifier is biased at class B or class AB, and the peak power amplifier is biased at class C. In addition, the primary power amplifier keeps being in a working state, and the peak power amplifier starts to work only when an input power reaches an initial working power.

As shown in FIG. 3, the first Doherty power amplification unit 31 includes a primary power amplifier 313 and a peak power amplifier 314; and the second Doherty power amplification unit 32 includes a primary power amplifier 324 and a peak power amplifier 323. The primary power amplifier 313 and the peak power amplifier 314 are connected in parallel. The primary power amplifier 324 and the peak power amplifier 323 are connected in parallel. It should be noted that, the primary power amplifier 313 and the peak power amplifier 314 need to be connected by using a Doherty combiner (which is not shown). The Doherty combiner is configured to combine signals that are amplified by the primary power amplifier 313 and the peak power amplifier 314. Correspondingly, the primary power amplifier 324 and the peak power amplifier 323 need to be connected by using a Doherty combiner.

In the first Doherty power amplification unit 31, a first microstrip 315 is connected in series at a rear end of the primary power amplifier 313, and a second microstrip 316 is connected in series at a front end of the peak power amplifier 314. The first microstrip 315 is used for impedance transformation, and the second microstrip 315 is used for phase balancing. The first microstrip 315 and the second microstrip 316 each may be a quarter-wave microstrip or an equivalent circuit.

Correspondingly, in the second Doherty power amplification unit 32, a third microstrip 325 is connected in series at a rear end of the primary power amplifier 324, and a fourth microstrip 326 is connected in series at a front end of the peak power amplifier 323. In addition, the third microstrip 325 has a same function as the first microstrip 315, and the fourth microstrip 326 has a same function as the second microstrip 316. The third microstrip 325 and the fourth microstrip 326 each may be a quarter-wave microstrip or an equivalent circuit.

When transistors having a same power are used in the primary power amplifier 313 and the peak power amplifier 314 in the first Doherty power amplification unit 31, the first Doherty power amplification unit 31 is a two-way symmetric Doherty power amplification unit. When transistors having different powers are used in the primary power amplifier 313 and the peak power amplifier 314 in the first Doherty power amplification unit 31, the first Doherty power amplification unit 31 is a two-way asymmetric Doherty power amplification unit. In this embodiment, the first Doherty power amplification unit 31 may be a two-way symmetric Doherty power amplification unit, or may be a two-way asymmetric Doherty power amplification unit. Correspondingly, the second Doherty power amplification unit 32 may be a two-way symmetric Doherty power amplification unit, or may be a two-way asymmetric Doherty power amplification unit. This is not limited in the present application.

It should be noted that, in this embodiment, a structure of the Doherty power amplification unit is similar to that of a classical Doherty power amplifier, and a structure of the two-way outphasing combiner is similar to that of an outphasing combiner in a classical outphasing power amplifier. A person skilled in the art may understand that, in this embodiment, the Doherty power amplification unit and the two-way outphasing combiner further include other conventional elements, and details are not described again in this embodiment.

In an optional embodiment, each Doherty power amplification unit may be a two-way Doherty power amplification unit, and may be an m-way Doherty power amplification unit. That is, each Doherty power amplification unit includes one primary power amplifier and (m−1) peak power amplifiers, where m≥2 and m is an integer. The following description is an example of an optional embodiment where m=3.

Figure 4:
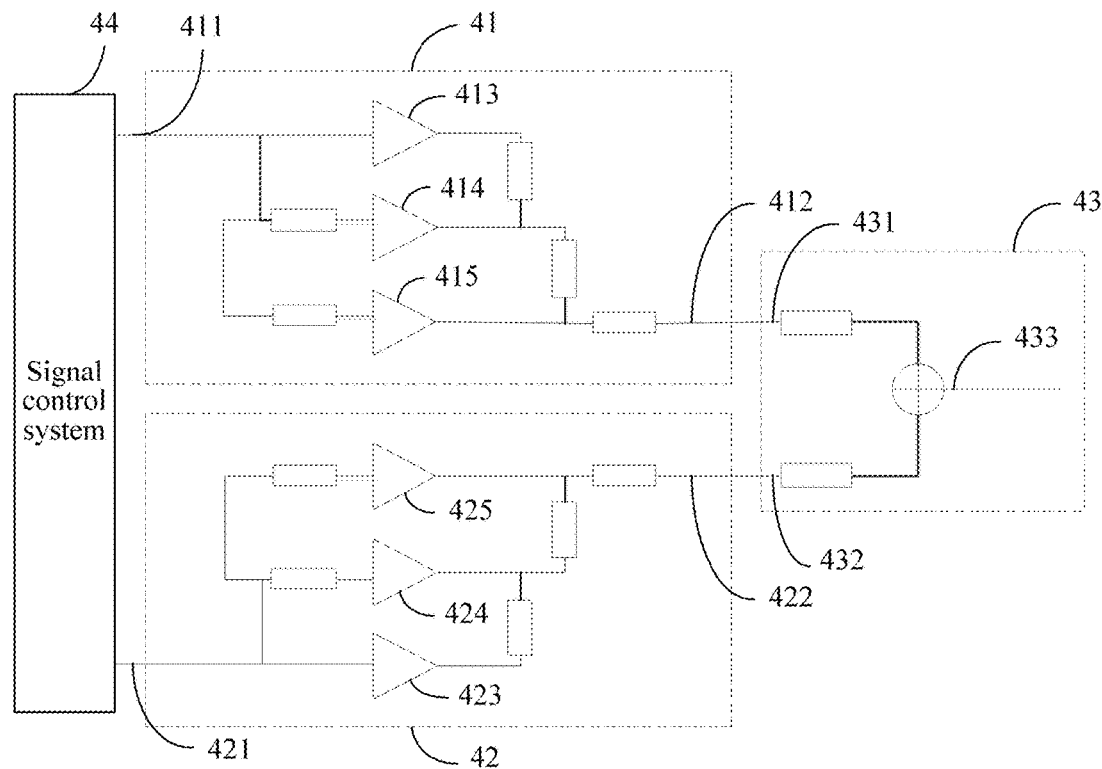
FIG. 4 is a schematic structural diagram of a power amplifier according to another embodiment of the present application.

Referring to FIG. 4, FIG. 4 is a schematic structural diagram of a power amplifier according to another embodiment of the present application. In this embodiment, that a Doherty power amplification unit in the power amplifier is a three-way Doherty power amplification unit is used as an example for description. The power amplifier includes a first Doherty power amplification unit 41 and a second Doherty power amplification unit 42 that are connected in parallel, where the first Doherty power amplification unit 41 includes an input end 411 and an output end 412, and the second Doherty power amplification unit 42 includes an input end 421 and an output end 422. The power amplifier also includes a two-way outphasing combiner 43 including two input ends and one output end, which are respectively a first input end 431, a second input end 432, and an output end 433. The two-way outphasing combiner may be a Chireix combiner or another combiner having an outphasing combination function. The type of the outphasing combiner is not limited in the present application.

The output end 412 of the first Doherty power amplification unit 41 is electrically connected to the first input end 431 of the two-way outphasing combiner 43. The output end 422 of the second Doherty power amplification unit 42 is electrically connected to the second input end 432 of the two-way outphasing combiner 43.

The input end 411 of the first Doherty power amplification unit 41 and the input end 421 of the second Doherty power amplification unit 42 are both configured to receive an input signal sent by a signal control system 44. The output end 412 of the first Doherty power amplification unit 41 and the output end 422 of the second Doherty power amplification unit 42 are both configured to send an amplified input signal to the two-way outphasing combiner 43. The two-way outphasing combiner 43 amplifies signals received by means of the first input end 431 and the second input end 432, combines the signals, and then sends, by means of the output end 433, the signals after combination to a transmitter (which is not shown) for transmission.

In FIG. 4, the first Doherty power amplification unit 41 and the second Doherty power amplification unit 42 each are a three-way Doherty power amplification unit. That is, the first Doherty power amplification unit 31 and the second Doherty power amplification unit 32 each include a primary power amplifier and two peak power amplifiers.

The primary power amplifier is biased at class B or class AB, and the peak power amplifiers are biased at class C. In addition, the primary power amplifier keeps being in a working state, and the peak power amplifiers start to work only when an input power reaches an initial working power corresponding to each peak power amplifier. In addition, the initial working powers corresponding to the peak power amplifiers may be the same or different. This is not limited in the present application.

As shown in FIG. 4, the first Doherty power amplification unit 41 includes a primary power amplifier 413, a first peak power amplifier 414, and a second peak power amplifier 415; and the second Doherty power amplification unit 42 includes a primary power amplifier 423, a first peak power amplifier 424, and a second peak power amplifier 425. The primary power amplifier is connected in parallel to the peak power amplifiers, and the peak power amplifiers are connected in parallel. Transistors having a same power or different powers may be used in the primary power amplifier and the peak power amplifiers. This is not limited in the present application.

It should be noted that, a person skilled in the art may understand that, in this embodiment, the three-way Doherty power amplification unit and the two-way outphasing combiner further include other conventional elements, and details are not described again in this embodiment.

In this embodiment of the present application, an outphasing combiner may include n input ends, where n≥2 and n is an integer. That is, the outphasing combiner may be an n-way outphasing combiner. Correspondingly, a power amplifier includes n Doherty power amplification units, and output ends of the Doherty power amplification units are separately connected to input ends of the n-way outphasing combiner.

In addition, the Doherty power amplification units may have a same quantity or different quantities of amplifiers. That is, a total quantity of power amplifiers included in each Doherty power amplification unit may be the same or different.

For example, a power amplifier includes a first Doherty power amplification unit, a second Doherty power amplification unit, and a third Doherty power amplification unit. The first Doherty power amplification unit, the second Doherty power amplification unit, and the third Doherty power amplification unit each include a primary power amplifier and a peak power amplifier.

For another example, a power amplifier includes a first Doherty power amplification unit, a second Doherty power amplification unit, and a third Doherty power amplification unit. The first Doherty power amplification unit includes a primary power amplifier and a peak power amplifier (that is, the first Doherty power amplification unit is a two-way Doherty unit). The second Doherty power amplification unit includes a primary power amplifier and two peak power amplifiers (that is, the second Doherty power amplification unit is a three-way Doherty unit). The third Doherty power amplification unit includes a primary power amplifier and three peak power amplifiers (that is, the third Doherty power amplification unit is a four-way Doherty unit).

When working, each power amplifier provided in the embodiments of the present application needs to trigger, according to an input power of a received signal, all or some of Doherty power amplification units and an outphasing combiner to be in a working state, thereby improving efficiency of the power amplifier.

Figure 5:
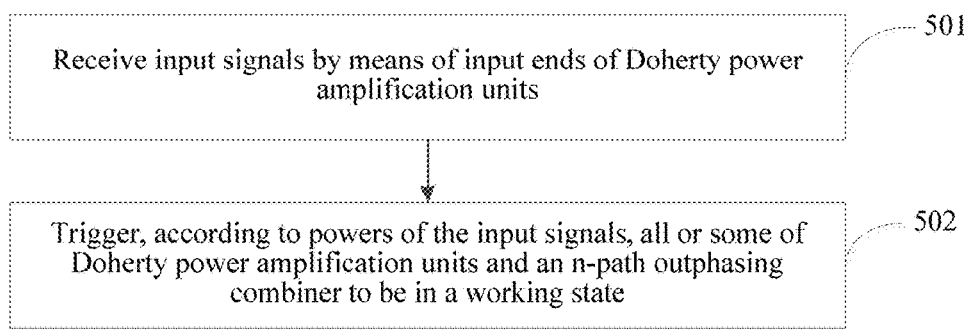
FIG. 5 is a method flowchart of a power amplification method according to an embodiment of the present application.

Referring to FIG. 5, FIG. 5 is a method flowchart of a power amplification method according to an embodiment of the present application. In this embodiment, that the power amplification method is applied to the power amplifiers shown in the foregoing embodiments. The power amplification method include the following steps.

Step 501: Receive input signals by means of input ends of Doherty power amplification units.

Step 502: Trigger, according to powers of the input signals, all or some of Doherty power amplification units and an n-way outphasing combiner to be in a working state.

In the power amplification method provided in this embodiment, a power amplifier having a structure including n Doherty power amplification units connected in parallel and an n-way outphasing combiner is used, and the power amplifier triggers, according to input powers of received signals, all or some of the Doherty power amplification units and the n-way outphasing combiner to be in a working state. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

During design of a power amplifier, a working mode of the power amplifier may be set to a first working mode or a second working mode according to an actual working need. In the first working mode, the power amplifier first triggers a Doherty power amplification unit to be in a working state, and then triggers an n-way outphasing combiner to be in a working state. In the second working mode, the power amplifier first triggers an n-way outphasing combiner to be in a working state, and then triggers a Doherty power amplification unit to be in a working state. The following makes descriptions by using two embodiments.

Figure 6A:
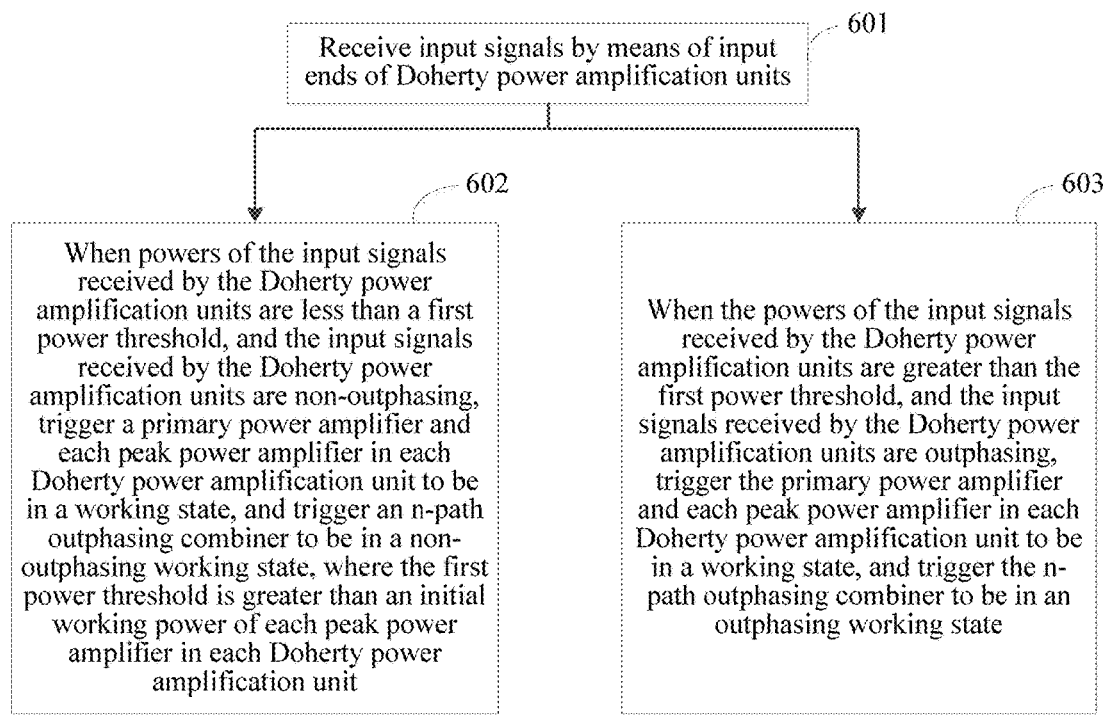
FIG. 6A is a method flowchart of a power amplification method according to another embodiment of the present application.

Referring to FIG. 6A, FIG. 6A is a method flowchart of a power amplification method according to another embodiment of the present application. In this embodiment, that the power amplification method is applied to a power amplifier working in a first working mode is used as an example for description. The power amplification method includes the following steps.

Step 601: Receive input signals by means of input ends of Doherty power amplification units.

Each Doherty power amplification unit in the power amplifier receives, by means of an input end, an input signal sent by a signal control system.

Step 602: When the power levels of each of the input signals received by the Doherty power amplification units are less than a first power threshold, and the input signals received by the Doherty power amplification units are non-outphasing, trigger a primary power amplifier and each peak power amplifier in each Doherty power amplification unit to be in a working state, and trigger an n-way outphasing combiner to be in a non-outphasing working state, where the first power threshold is greater than an initial working power of each peak power amplifier in each Doherty power amplification unit.

During design of a power amplifier, a power threshold needs to be designed in advance for the power amplifier. The power threshold is used to trigger all or some of the Doherty power amplification units and the n-way outphasing combiner to be in a working state.

For the power amplifier that is set to working in the first working mode, the first power threshold corresponding to the power amplifier needs to be greater than an initial working power of each peak power amplifier in each Doherty power amplification unit, thereby ensuring that before a power of an input signal reaches the first power threshold, a primary power amplifier and each peak power amplifier in each Doherty power amplification unit are in a working state.

In addition, when the power levels of the input signals are less than the first power threshold, the input signals sent by the signal control system to the Doherty power amplification units are non-outphasing input signals. The Doherty power amplification units amplify the non-outphasing input signals (which are still non-outphasing input signals). The n-way outphasing combiner is intended for combining n outphasing input signals, and when powers of input signals are less than the first power threshold, the signals received by the n-way outphasing combiner are non-outphasing input signals. Therefore, when powers of input signals are less than the first power threshold, the n-way outphasing combiner is in a non-outphasing working state. The non-outphasing working state is a working state in which the n-way outphasing combiner directly combines signals received by the input ends, and does not need to perform phase adjustment.

Step 603: When the power levels of the input signals received by the Doherty power amplification units are greater than the first power threshold, and the input signals received by the Doherty power amplification units are outphasing, trigger the primary power amplifier and each peak power amplifier in each Doherty power amplification unit to be in a working state, and trigger the n-way outphasing combiner to be in an outphasing working state.

When the power levels of the input signals received by the Doherty power amplification units are greater than the first power threshold, the primary power amplifier and each peak power amplifier in each Doherty power amplification unit are in a working state. As the power levels of the input signals continuously increase, the primary power amplifier and each peak power amplifier are in a saturation status, and work with highest efficiency.

In addition, when the power levels of the input signals are greater than the first power threshold, the signal control system adjusts the input signals sent to the Doherty power amplification units to outphasing input signals, and the Doherty power amplification units amplify powers of the outphasing input signals (which are still outphasing input signals). In this case, when the input ends of the n-way outphasing combiner receive n outphasing signals, the n-way outphasing combiner is triggered to be in an outphasing working state. The outphasing working state is a working state in which the n-way outphasing combiner performs phase adjustment on signals received by the input ends, and then combines the signals.

Briefly, when an input power is relatively low, a power amplifier working in the first working mode works in a Doherty mode, to improve efficiency under a low power condition; and when an input power is relatively high, the power amplifier works in an outphasing mode, to maintain high efficiency under a high power condition.

Figure 6B:
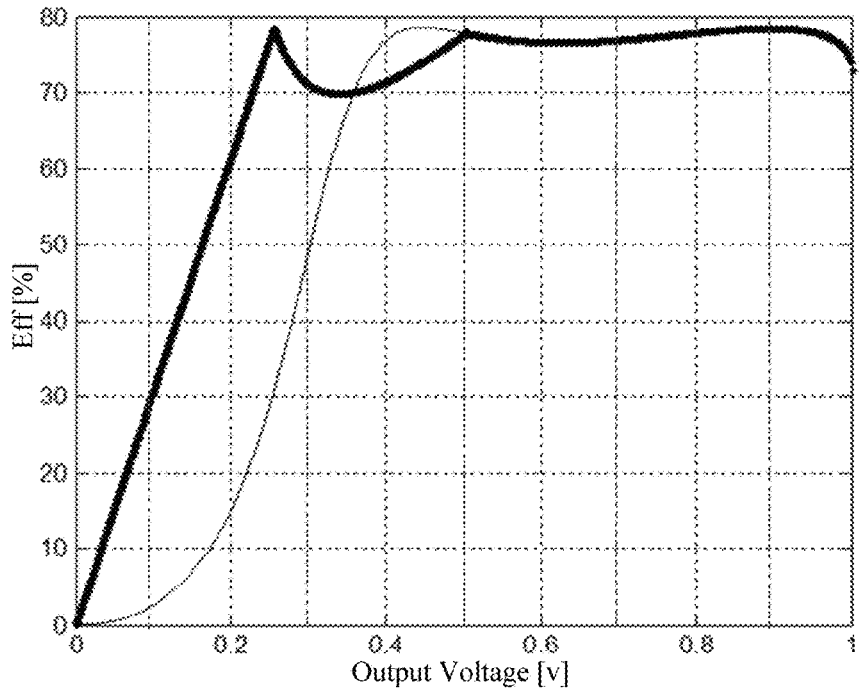
FIG. 6B is an efficiency curve chart of a power amplifier in a first working mode according to an embodiment of the present application.

FIG. 6B is an efficiency curve chart of a power amplifier in a first working mode according to the present application. In the first working mode, when an input power is relatively low, the power amplifier works in a Doherty mode, and an efficiency curve of the power amplifier is an efficiency curve of a Doherty power amplifier. When an input power is relatively high, the power amplifier works in an outphasing mode, and an efficiency curve of the power amplifier is an efficiency curve of an outphasing power amplifier. Compared with a conventional Doherty power amplifier, the power amplifier can maintain high efficiency within a larger input power range.

In the power amplification method provided in this embodiment, a power amplifier having a structure including n Doherty power amplification units connected in parallel and an n-way outphasing combiner is used, and the power amplifier triggers, according to input powers of received signals, all or some of the Doherty power amplification units and the n-way outphasing combiner to be in a working state. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

Figure 7A:
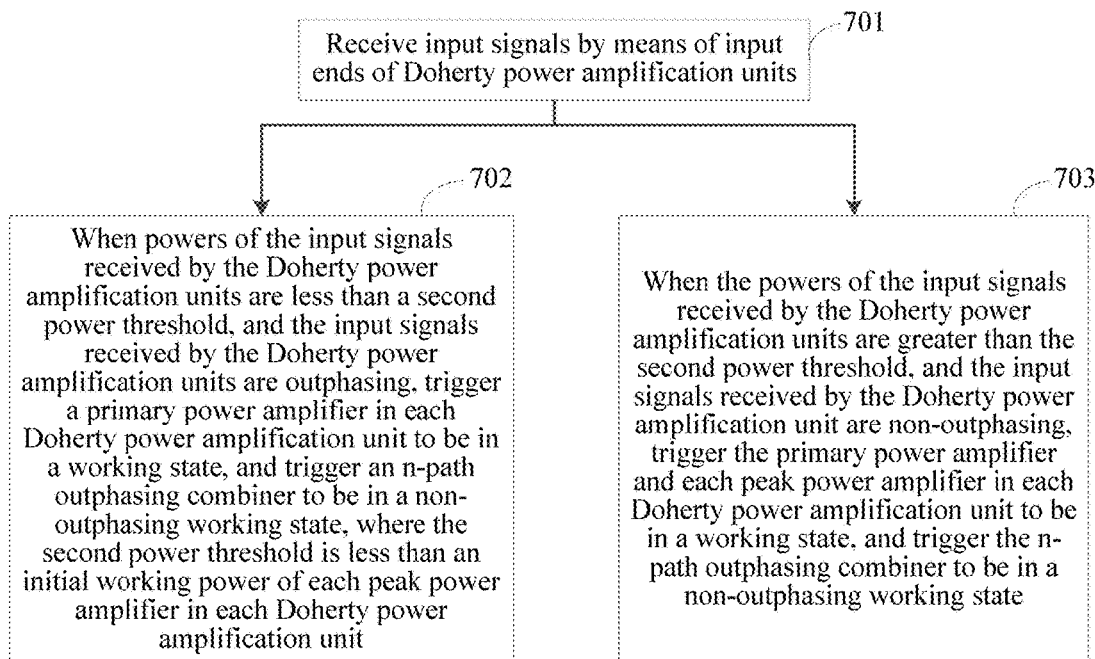
FIG. 7A is a method flowchart of a power amplification method according to still another embodiment of the present application.

Referring to FIG. 7A, FIG. 7A is a method flowchart of a power amplification method according to still another embodiment of the present application. In this embodiment, that the power amplification method is applied to a power amplifier working in a second working mode is used as an example for description. The power amplification method includes the following steps.

Step 701: Receive, by means of input ends of Doherty power amplification units, input signals sent by a signal control system.

Each Doherty power amplification unit in the power amplifier receives an input signal by means of an input end.

Step 702: When powers of the input signals received by the Doherty power amplification units are less than a second power threshold, and the input signals received by the Doherty power amplification units are outphasing, trigger a primary power amplifier in each Doherty power amplification unit to be in a working state, and trigger an n-way outphasing combiner to be in a non-outphasing working state, where the second power threshold is less than an initial working power of each peak power amplifier in each Doherty power amplification unit.

During design of a power amplifier, a power threshold needs to be designed in advance for the power amplifier. The power threshold is used to trigger all or some of the Doherty power amplification units and the n-way outphasing combiner to be in a working state.

For the power amplifier that is set to working in the first working mode, the second power threshold corresponding to the power amplifier needs to be less than an initial working power of each peak power amplifier in each Doherty power amplification unit, thereby ensuring that before a power of an input signal reaches the first power threshold, no peak power amplifier in the Doherty power amplification units starts to work.

In addition, when the power levels of the input signals are less than the second power threshold, signals sent by the signal control system to the Doherty power amplification units are outphasing input signals. No peak power amplifier in the Doherty power amplification units starts to work. Therefore, only the primary power amplifiers amplify the power levels of the outphasing input signals (the amplified signals are still outphasing signals). The n-way outphasing combiner is intended for combining n outphasing signals. Therefore, when input ends of the n-way outphasing combiner receive n outphasing signals sent by the Doherty power amplification units, the n-way outphasing combiner is working in an outphasing working state. The outphasing working state is a working state in which the n-way outphasing combiner performs phase adjustment on signals received by the input ends, and then combines the signals.

Step 703: When the power levels of the input signals received by the Doherty power amplification units are greater than the second power threshold, and the input signals received by the Doherty power amplification units are non-outphasing, trigger the primary power amplifier and each peak power amplifier in each Doherty power amplification unit to be in a working state, and trigger the n-way outphasing combiner to be in a non-outphasing working state.

When the power levels of the input signals received by the Doherty power amplification units are greater than the second power threshold, as the power levels of the input signals increase, peak power amplifiers in the Doherty power amplification units successively enter a working state.

In addition, when the power levels of the input signals are greater than the second power threshold, the signal control system adjusts the input signals sent to the Doherty power amplification units to non-outphasing input signals, and the primary power amplifiers and peak power amplifiers in the Doherty power amplification units amplify powers of the non-outphasing input signals (the amplified signals are still non-outphasing signals). In this case, because signals received by the input ends of the n-way outphasing combiner are n non-outphasing signals, the n-way outphasing combiner is triggered to be in a non-outphasing working state. The non-outphasing working state is a working state in which the n-way outphasing combiner directly combines signals received by the input ends, and does not need to perform phase adjustment.

Figure 7B:
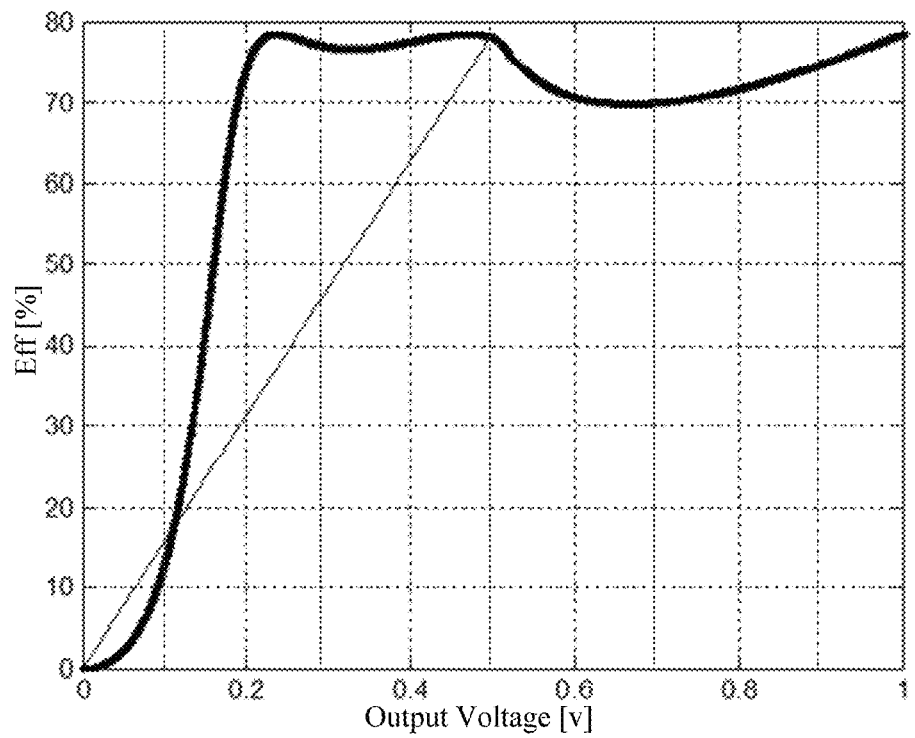
FIG. 7B is an efficiency curve chart of a power amplifier in a second working mode according to an embodiment of the present application.

FIG. 7B is an efficiency curve chart of a power amplifier in a second working mode according to the present application. In the second working mode, when an input power is relatively low, the power amplifier works in an outphasing mode, and an efficiency curve of the power amplifier is an efficiency curve of an outphasing power amplifier. When an input power is relatively high, the power amplifier works in a Doherty mode, and an efficiency curve of the power amplifier is an efficiency curve of a Doherty power amplifier. Compared with a conventional Doherty power amplifier, the power amplifier can maintain high efficiency within a larger input power range.

In the power amplification method provided in this embodiment, a power amplifier having a structure including n Doherty power amplification units connected in parallel and an n-way outphasing combiner is used, and the power amplifier triggers, according to input powers of received signals, all or some of the Doherty power amplification units and the n-way outphasing combiner to be in a working state. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

Figure 8:
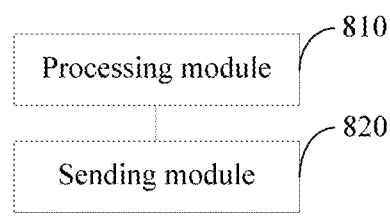
FIG. 8 is a structural block diagram of a power amplification control apparatus according to an embodiment of the present application.

Referring to FIG. 8, FIG. 8 is a structural block diagram of a power amplification control apparatus according to an embodiment of the present application. The power amplification control apparatus is applied to a signal control system. The signal control system is used to provide an input signal for the power amplifier shown in FIG. 3 or FIG. 4. The power amplification control apparatus includes a processing module 810, configured to determine, according to a working mode of the power amplifier, a power threshold corresponding to the power amplifier, where the power threshold is used to instruct the signal control system to adjust, when powers of the n input signals reach the power threshold, the n input signals to n non-outphasing input signals or n outphasing input signals. The processing module Bio is further configured to adjust, when the power levels of the n input signals reach the power threshold, the n input signals to the n non-outphasing input signals or the n outphasing input signals. The power amplification control apparatus also includes a sending module 820, configured to send the n adjusted input signals separately to input ends of the Doherty power amplification units.

The power amplification control apparatus provided in this embodiment determines, according to a working mode of a power amplifier, a power threshold corresponding to the power amplifier, and adjusts input signals when powers of the input signals reach the power threshold, so that the input signals conform to the working mode of the power amplifier. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

Based on FIG. 8, optionally, the working mode of the power amplifier is the first working mode, and the corresponding power threshold is a first power threshold, where the first power threshold is greater than an initial working power of each peak power amplifier in each Doherty power amplification unit. The processing module Bio is further configured to adjust, when the power levels of the n input signals reach the first power threshold, the n input signals to the n outphasing input signals.

Optionally, the processing module Bio is further configured to adjust, when the power levels of the n input signals do not reach the first power threshold, the n input signals to the n non-outphasing input signals.

Optionally, the working mode of the power amplifier is the second working mode, and the corresponding power threshold is a second power threshold, where the second power threshold is less than an initial working power of each peak power amplifier in each Doherty power amplification unit. The processing module 810 is further configured to adjust, when the power levels of the n input signals reach the second power threshold, the n input signals to the n non-outphasing input signals.

Optionally, the processing module 810 is configured to adjust, when the power levels of the n input signals do not reach the second power threshold, the n input signals to the n outphasing input signals.

Figure 9:
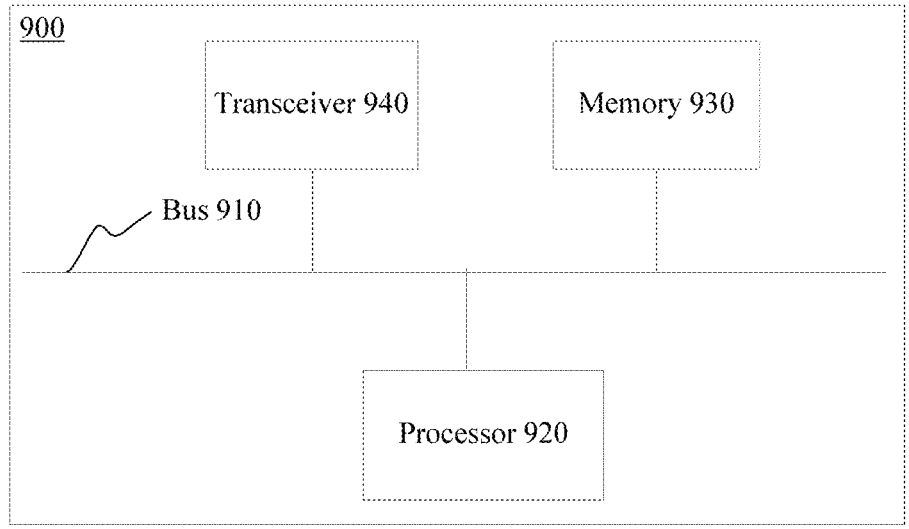
FIG. 9 is a block diagram of a power amplification control apparatus according to an embodiment of the present application.

Referring to FIG. 9, FIG. 9 is a block diagram of a power amplification control apparatus according to an embodiment of the present application. The power amplification control apparatus 900 may include: a bus 910, and a processor 920, a memory 930, and a transceiver 940 that are connected by using the bus 910. The memory 1030 is configured to store one or more instructions. The one or more instructions are configured to be performed by the processor 920.

The processor 920 is configured to determine, according to a working mode of a power amplifier, a power threshold corresponding to the power amplifier, where the power threshold is used to instruct the signal control system to adjust, when powers of the n input signals reach the power threshold, the n input signals to n non-outphasing input signals or n outphasing input signals. The processor 920 is further configured to adjust, when the power levels of the n input signals reach the power threshold, the n input signals to the n non-outphasing input signals or the n outphasing input signals. The processor 920 is further configured to control the transceiver 940 to send the n adjusted input signals separately to input ends of the Doherty power amplification units.

Optionally, the working mode of the power amplifier is the first working mode, and the corresponding power threshold is a first power threshold, where the first power threshold is greater than an initial working power of each peak power amplifier in each Doherty power amplification unit. The processor 920 is further configured to adjust, when the power levels of the n input signals reach the first power threshold, the n input signals to the n outphasing input signals.

Optionally, the processor 920 is further configured to adjust, when the power levels of the n input signals do not reach the first power threshold, the n input signals to the n non-outphasing input signals.

Optionally, the working mode of the power amplifier is the second working mode, and the corresponding power threshold is a second power threshold, where the second power threshold is less than an initial working power of each peak power amplifier in each Doherty power amplification unit. The processor 920 is further configured to adjust, when the power levels of the n input signals reach the second power threshold, the n input signals to the n non-outphasing input signals.

Optionally, the processor 920 is further configured to adjust, when the power levels of the n input signals do not reach the first power threshold, the n input signals to the n outphasing input signals.

The power amplification control apparatus provided in this embodiment determines, according to a working mode of a power amplifier, a power threshold corresponding to the power amplifier, and adjusts input signals when powers of the input signals reach the power threshold, so that the input signals conform to the working mode of the power amplifier. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

To ensure high working efficiency of the power amplifier, a signal control system providing input signals for the power amplifier needs to adjust the input signals in real time according to a power threshold corresponding to a working mode of the power amplifier. The following makes descriptions by using an embodiment.

Figure 10:
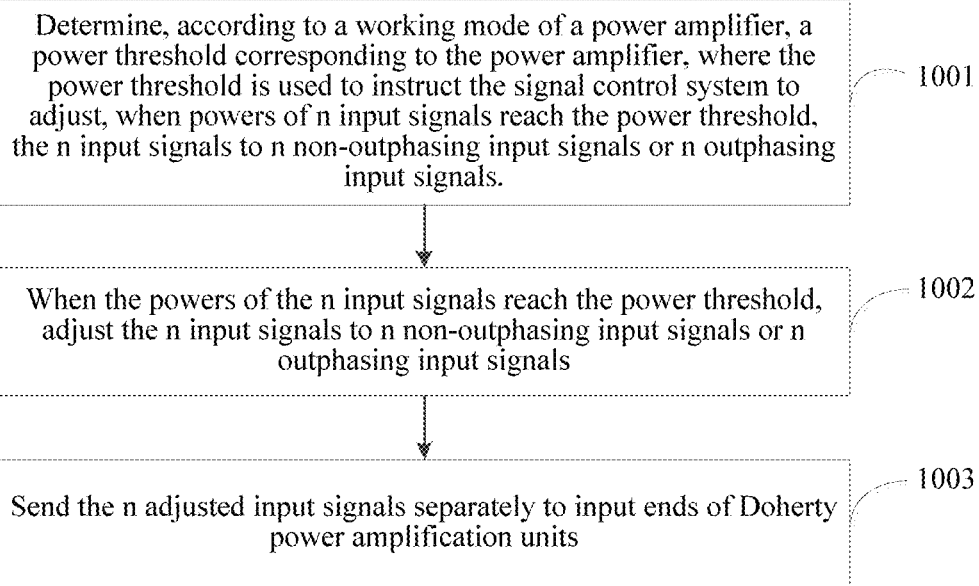
FIG. 10 is a flowchart of a power amplification control method according to an embodiment of the present application.

Referring to FIG. 10, FIG. 10 is a flowchart of a power amplification control method according to an embodiment of the present application. In this embodiment, that the power amplification control method is applied to the signal control system in the foregoing embodiments is used as an example for description. The method includes the following steps.

Step 1001: Determine, according to a working mode of a power amplifier, a power threshold corresponding to the power amplifier, where the power threshold is used to instruct the signal control system to adjust, when powers of n input signals reach the power threshold, the n input signals to n non-outphasing input signals or n outphasing input signals.

The signal control system may further determine, according to powers of signals that need to be amplified and the working mode of the power amplifier, how to set n input signals when powers of the n input signals do not reach the power threshold.

Step 1002: When the power levels of the n input signals reach the power threshold, adjust the n input signals to n non-outphasing input signals or n outphasing input signals.

When the power levels of the n input signals do not reach the power threshold, the signal control system sets the n input signals in a signal setting manner corresponding to the n input signals that is determined in step 1001 when the power levels of the n input signals do not reach the power threshold.

Step 1003: Send the n adjusted input signals separately to input ends of Doherty power amplification units.

In the power amplification control method provided in this embodiment, a power threshold corresponding to a power amplifier is determined according to a working mode of the power amplifier, and input signals are adjusted when powers of the input signals reach the power threshold, so that the input signals conform to the working mode of the power amplifier. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

Figure 11:
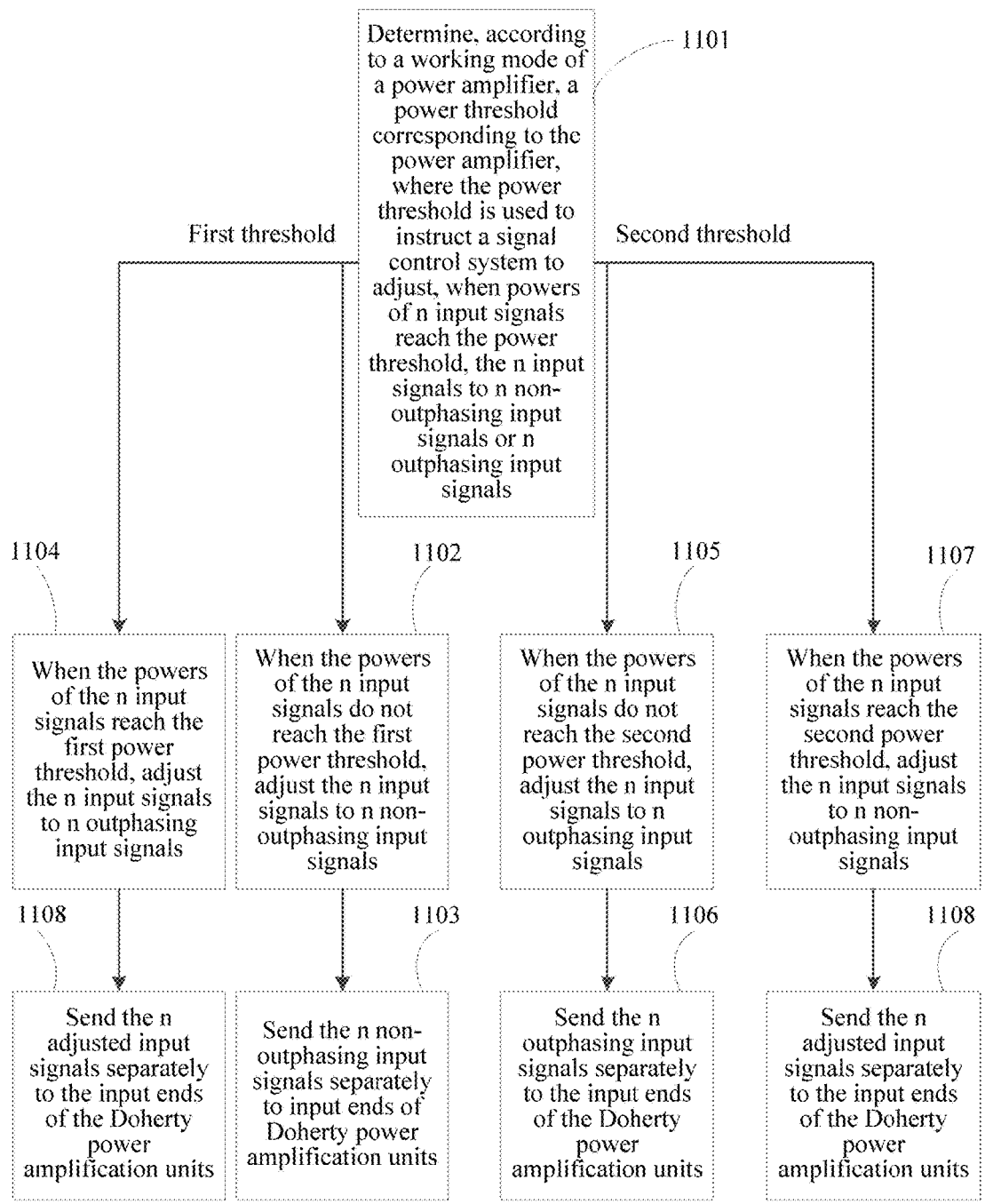
FIG. 11 is a flowchart of a power amplification control method according to another embodiment of the present application.

Referring to FIG. 11, FIG. 11 is a flowchart of a power amplification control method according to another embodiment of the present application. In this embodiment, that the power amplification control method is applied to the signal control system shown in FIG. 3 or FIG. 4 is used as an example for description. The method includes the following steps.

Step 1101: Determine, according to a working mode of a power amplifier, a power threshold corresponding to the power amplifier, where the power threshold is used to instruct the signal control system to adjust, when powers of n input signals reach the power threshold, the n input signals to n non-outphasing input signals or n outphasing input signals.

The signal control system may store in advance power thresholds corresponding to a power amplifier in various working modes. When a skilled person selects a working mode of a to-be-connected power amplifier, the signal control system can obtain a power threshold corresponding to the working mode.

The power amplifier provided in the embodiments of the present application includes two working modes, and the two working modes correspond to different power thresholds. Therefore, when a working mode of the power amplifier connected to the signal control system is a first working mode, the signal control system determines that a power threshold corresponding to the power amplifier is a first power threshold; and when a working mode of the power amplifier connected to the signal control system is a second working mode, the signal control system determines that a power threshold corresponding to the power amplifier is a second power threshold.

The first power threshold is greater than an initial working power of each peak power amplifier in each Doherty power amplification unit, thereby ensuring that when an input power reaches the first power threshold, each peak power amplifier in the Doherty power amplification unit is in a working state; and the second power threshold is less than an initial working power of each peak power amplifier in each Doherty power amplification unit, thereby ensuring that when an input power reaches the second power threshold, no peak power amplifier in the Doherty power amplification units starts to work.

Step 1102: When the power levels of the n input signals do not reach the first power threshold, adjust the n input signals to n non-outphasing input signals.

In the first working mode, to enable the power amplifier to work in a Doherty mode when a power of an input signal is relatively low, that is, each Doherty power amplification unit in the power amplifier is in a working state, and an outphasing combiner is in a non-outphasing working state, when the power levels of the n input signals do not reach the first power threshold, the signal control system needs to adjust the n input signals to n non-outphasing input signals. The outphasing working state is a working state in which the n-way outphasing combiner directly combines signals received by input ends, and does not need to perform phase adjustment.

Step 1103: Send the n non-outphasing input signals separately to input ends of Doherty power amplification units.

The n-way outphasing combiner is intended for combining n outphasing signals. Therefore, when input ends of the n-way outphasing combiner receive n non-outphasing signals, the n-way outphasing combiner is in a non-outphasing working state, and combines the received non-outphasing signals.

Step 1104: When the power levels of the n input signals reach the first power threshold, adjust the n input signals to n outphasing input signals.

In the first working mode, to enable the power amplifier to work in an outphasing mode when a power of an input signal is relatively high, that is, each Doherty power amplification unit in the power amplifier is in a working state, and an outphasing combiner is in an outphasing working state, when the power levels of the n input signals reach the first power threshold, the signal control system needs to adjust the n input signals to n outphasing input signals.

After performing the foregoing step 1104, the signal control system performs step 1108.

Step 1105: When the power levels of the n input signals do not reach the second power threshold, adjust the n input signals to n outphasing input signals.

In the second working mode, to enable the power amplifier to work in an outphasing mode when a power of an input signal is relatively low, that is, in each Doherty power amplification unit in the power amplifier, only a primary power amplifier is in a working state, and the n-way outphasing combiner is in an outphasing working state, when the power levels of the n input signals do not reach the second power threshold, the signal control system needs to adjust the n input signals to n outphasing input signals, so as to trigger the n-way outphasing combiner to enter an outphasing working state.

Step 1106: Send the n outphasing input signals separately to the input ends of the Doherty power amplification units.

Correspondingly, when the input ends of the n-way outphasing combiner receive n outphasing input signals, the n-way outphasing combiner is triggered to enter an outphasing working state, and performs phase adjustment on the n received outphasing input signals, and then combines the signals.

Step 1107: When the power levels of the n input signals reach the second power threshold, adjust the n input signals to n non-outphasing input signals.

In the second working mode, to enable the power amplifier to work in a Doherty mode when a power of an input signal is relatively high, that is, a primary power amplifier and each peak power amplifier in each Doherty power amplification unit in the power amplifier are in a working state, and an outphasing combiner is in a non-outphasing working state, when the power levels of the n input signals reach the second power threshold, the signal control system needs to adjust the n outphasing input signals to n non-outphasing input signals.

After performing the foregoing step 1107, the signal control system performs step 1108.

Step 1108: Send the n adjusted input signals separately to the input ends of the Doherty power amplification units.

Correspondingly, the Doherty power amplification units receive the n adjusted input signals by means of the input ends of the Doherty power amplification units, amplify the input signals, and send the amplified signals to the n-way outphasing combiner for combination. After the foregoing step 1104 is performed, the n outphasing input signals trigger the n-way outphasing combiner to enter an outphasing working state; and after the foregoing step 1107 is performed, the n non-outphasing input signals trigger the n-way outphasing combiner to enter a non-outphasing working state.

In the power amplification control method provided in this embodiment, a power threshold corresponding to a power amplifier is determined according to a working mode of the power amplifier, and input signals are adjusted when powers of the input signals reach the power threshold, so that the input signals conform to the working mode of the power amplifier. Therefore, the problem that if a Doherty power amplifier having the existing architecture is used, to maintain high efficiency, a corresponding input power changing range is relatively small, and power consumption increases when the input power changing range is relatively large is resolved. High efficiency is maintained within a larger input power changing range by using the power amplifier having this structure, thereby further reducing power consumption.

A person of ordinary skill in the art may understand that all or some of the steps of the embodiments may be implemented by hardware or a program instructing related hardware. The program may be stored in a computer-readable storage medium. The storage medium may include: a read-only memory, a magnetic disk, or an optical disc.

The foregoing descriptions are merely examples of embodiments of the present application, but are not intended to limit the present application. Any modification, equivalent replacement, and improvement made without departing from the spirit and principle of the present application shall fall within the protection scope of the present application.

What is claimed is:

1. A device comprising:
    a power amplifier, the power amplifier comprising n Doherty power amplifiers and an n-way outphasing combiner, wherein the n Doherty power amplifiers are connected in parallel, wherein n≥2 and n is an integer;
    wherein each of the n Doherty power amplifiers comprises one input end and one output end;
    wherein the n-way outphasing combiner comprises n input ends and one output end;
    wherein the output ends of the n Doherty power amplifiers are separately connected to a respective one of the n input ends of the n-way outphasing combiner;
    wherein each of the n Doherty power amplifiers has a respective power threshold; and
    wherein the power amplifier is configured to:
        when an input signal received on each of the n Doherty power amplifiers is less than the respective power threshold and the input signal is outphasing, operate the n-way outphasing combiner in an outphasing working state,
        when an input signal received on each of the n Doherty power amplifiers is less than the respective power threshold and the input signal is non-outphasing, operate the n-way outphasing combiner in a non-outphasing working state,
        when an input signal received on each of the n Doherty power amplifiers is greater than the respective power threshold and the input signal is outphasing, operate the n-way outphasing combiner in an outphasing working state, and
        when an input signal received on each of the n Doherty power amplifiers is greater than the respective power threshold and the input signal is non-outphasing, operate the n-way outphasing combiner in a non-outphasing working state.

2. The device according to claim 1,
    wherein each of the n Doherty power amplifiers is an m-way Doherty power amplifier, the m-way Doherty power amplifier comprising one primary power amplifier and m−1 peak power amplifiers, wherein m≥2 and m is an integer;
    wherein the value of m in each of the n Doherty power amplifiers may have a same value or different value; and
    wherein, in each m-way Doherty power amplifier, the primary power amplifier is connected in parallel to each peak power amplifier, and the m−1 peak power amplifiers are each connected in parallel.

3. The device according to claim 2,
    wherein a first amplifier of the n Doherty power amplifiers is an m1-way Doherty power amplifier where m of the first amplifier equals m1, and wherein a second amplifier of the n Doherty power amplifiers is an m2-way Doherty amplifier, where m of the second amplifier equals m2, where m1 is not equal to m2.

4. The device according to claim 2,
    wherein each m-way Doherty power amplifiers is a two-way symmetric Doherty power amplifier, the two-way symmetric Doherty power amplifier comprising one primary power amplifier and one peak power amplifier, and transistors having a same power are used in the primary power amplifier and the peak power amplifier; or
    wherein each m-way Doherty power amplifier is a two-way asymmetric Doherty power amplifier, the two-way asymmetric Doherty power amplifier comprising one primary power amplifier and one peak power amplifier, and transistors having different powers are used in the primary power amplifier and the peak power amplifier.

5. The device according to claim 1, wherein the n-way outphasing combiner is an Chireix combiner.

6. An apparatus comprising:
    a power amplifier, the power amplifier comprising n Doherty power amplifiers, wherein n≥2 and n is an integer, wherein each of then Doherty power amplifiers comprises one input end and one output end;
    a processor of a signal control system, the signal control system configured to provide n input signals to the power amplifier; and a computer-readable storage medium storing a program to be executed by the processor, the program including instructions for:
  determining, according to a working mode of the power amplifier, a power threshold corresponding to the power amplifier;
  adjusting, when power levels of the n input signals reach the power threshold, the n input signals to n non-outphasing input signals or n outphasing input signals; and
  controlling a transceiver to send the n adjusted input signals separately to the input ends of the Doherty power amplifiers.

7. The apparatus according to claim 6, wherein the working mode of the power amplifier is a first working mode, and the corresponding power threshold is a first power threshold, wherein the first power threshold is greater than an initial working power of each peak power amplifier in each Doherty power amplifier; and
  the program further includes instructions for adjusting, when the power levels of the n input signals reach the first power threshold, the n input signals to the n outphasing input signals.

8. The apparatus according to claim 7, wherein the program further includes instructions for adjusting, when the power levels of the n input signals do not reach the first power threshold, the n input signals to the n non-outphasing input signals.

9. The apparatus according to claim 6, wherein the working mode of the power amplifier is a second working mode, and the corresponding power threshold is a second power threshold, wherein the second power threshold is less than an initial working power of each peak power amplifier in each Doherty power amplifier; and
  the program further includes instructions for adjusting, when the power levels of the n input signals reach the second power threshold, the n input signals to the n non-outphasing input signals.

10. The apparatus according to claim 9, wherein the program further includes instructions for adjusting, when the power levels of the n input signals do not reach the second power threshold, the n input signals to the n outphasing input signals.

11. The apparatus according to claim 6,
  wherein each of the n Doherty power amplifiers is an m-way Doherty power amplifier, the m-way Doherty power amplifiers comprising m power amplifiers, wherein the m power amplifiers include one primary power amplifier and m−1 peak power amplifiers, wherein m≥2 and m is an integer;
  wherein the value of m in each of the n Doherty power amplifiers may have a same value or different value; and
  wherein, in each m-way Doherty power amplifier, the primary power amplifier is connected in parallel to each peak power amplifier, and the m−1 peak power amplifiers are each connected in parallel.

12. The apparatus according to claim 11, wherein the n non-outphasing input signals or the n outphasing input signals are associated with a Chireix combiner.

13. The apparatus according to claim 11,
  wherein each m-way Doherty power amplifier is a two-way symmetric Doherty power amplifier, the two-way symmetric Doherty power amplifier comprising one primary power amplifier and one peak power amplifier, and transistors having a same power are used in the primary power amplifier and the peak power amplifier; or
  wherein each m-way Doherty power amplifier is a two-way asymmetric Doherty power amplifier, the two-way asymmetric Doherty power amplifier comprising one primary power amplifier and one peak power amplifier, and transistors having different powers are used in the primary power amplifier and the peak power amplifier.

14. A method, comprising:
receiving a plurality of input signals at input ends of a plurality of Doherty power amplifiers;
triggering each amplifier of the plurality of Doherty power amplifiers to be in a working state according to a power level of a corresponding input signal of the plurality of input signals; and
triggering an outphasing combiner to be in a working state according to the power level of the corresponding input signal of the plurality of input signals, wherein the triggering includes that when the power levels of the plurality of input signals are less than a first power threshold and when the input signals are non-outphasing, the outphasing combiner is triggered to be in a non-outphasing working state, wherein the outphasing combiner is coupled to output ends of the plurality of Doherty power amplifiers.

15. The method of claim 14, wherein each of the plurality of Doherty power amplifiers comprises a primary power amplifier and at least one peak power amplifier.

16. The method of claim 15, wherein the primary power amplifier and the at least one peak power amplifier in each Doherty power amplifiers are triggered to be in a working state, and wherein the non-outphasing working state is where the input signals are received by the plurality of Doherty power amplifiers without being phase adjusted.

17. The method of claim 16, wherein the triggering further includes that, when the power levels of the plurality of input signals are greater than the first power threshold and when the input signals are outphasing, the primary power amplifier and the at least one peak power amplifier in each Doherty power amplifier are triggered to be in a working state, and the outphasing combiner is triggered to be in an outphasing working state, wherein the outphasing working state is where the input signals are received by the plurality of Doherty power amplifiers after being phase adjusted.

18. The method of claim 15, wherein each of the plurality of Doherty power amplifiers comprises one input end and one output end, wherein each of the plurality of Doherty power amplifiers are connected in parallel, wherein a total number of power amplifiers in each of the plurality of Doherty power amplifiers is m, wherein the m power amplifiers include one primary power amplifier and m−1 peak power amplifiers, wherein m≥2 and m is an integer m.

19. The method of claim 18, wherein a value of m for a first amplifier of the plurality of Doherty power amplifiers is different than a value of m for a second amplifier of the plurality of Doherty power amplifiers.

20. The method of claim 15, wherein each of the plurality of Doherty power amplifiers is a two-way symmetric Doherty power amplifier, or wherein each of the plurality of Doherty power amplifiers is a two-way asymmetric Doherty power amplifier.

* * * * *